METHOD OF MAKING MESAS FOR DIODES BY ETCHING

Filed Jan. 27, 1960 2 Sheets-Sheet 1

INVENTORS
RALPH F. HOECKELMAN
WILLIAM M. LENARD
BY ARTHUR M. RICKEL JR.
Richard J. Seeger
ATTORNEY

METHOD OF MAKING MESAS FOR DIODES BY ETCHING

Filed Jan. 27, 1960 2 Sheets-Sheet 2

INVENTORS
RALPH F. HOECKELMAN
WILLIAM M. LENARD
BY ARTHUR M. RICKEL JR.
Richard J. Seeger
ATTORNEY

United States Patent Office 3,154,450
Patented Oct. 27, 1964

3,154,450

METHOD OF MAKING MESAS FOR DIODES BY ETCHING

Ralph F. Hoeckelman, Farmington, William M. Lenard, Dearborn, and Arthur M. Rickel, Jr., Garden City, Mich., assignors to The Bendix Corporation, a corporation of Delaware Filed Jan. 27, 1960, Ser. No. 4,998
1 Claim. (Cl. 156—17)

This invention pertains to a method of chemical machining and, more particularly, to machining of miniature parts.

It is an object of this invention to provide a method for machining material portions by first masking or covering a base material with light sensitive masking material that will harden to chemical action on exposure to light, then placing a negative over the masking material which has transparent areas corresponding to the areas where machining is desired, then exposing the negative to a light source which will harden the areas of the masking material underneath the transparent portions of the negative, then developing the masking material in a developer which will dissolve the unexposed portions of the masking material, so that areas of the base material are exposed corresponding to the opaque areas on the negative and with such exposed base material areas subject then to plating with a material that may be used for electrical contact or other purposes, dissolving the masking material and then etching the base material with an etch that will form a protective coating with the plated material but will etch the base material.

It is a further object of this invention to provide a method of manufacture for miniature objects such as diodes by first taking a silicon base material, coating it with electroless nickel, applying to the nickel coating a masking material such as Kodak Photo Resist material, available from the Eastman Kodak Company, which hardens to chemical action on exposure to light, placing thereon a negative having a series of uniform opaque dots, exposing the negative to ultra violet light, developing the masking material with a Kodak Photo Resist developer which will dissolve the unexposed areas of the masking material creating a series of uniform holes in the masking material, electroplating lead onto the nickel plate exposed by dissolution of the masking material, removing the masking material leaving a series of lead projections on the nickel plate, etching the uncovered nickel plate and a predetermined portion of the silicon base with an etching solution, which protects the lead from the etching action, to provide a series of mesas having silicon, nickel plate, and lead layers, waxing the etched surface of the silicon, dicing or drawing lines through the wax to expose a grid of lines of the silicon base to divide the silicon base into small squares each having a lead mesa thereon and etching the exposed lines to separate the small squares.

These and other objects and advantages of this invention will become more apparent when a preferred embodiment is considered in connection with the drawings in which.

Figure 1:
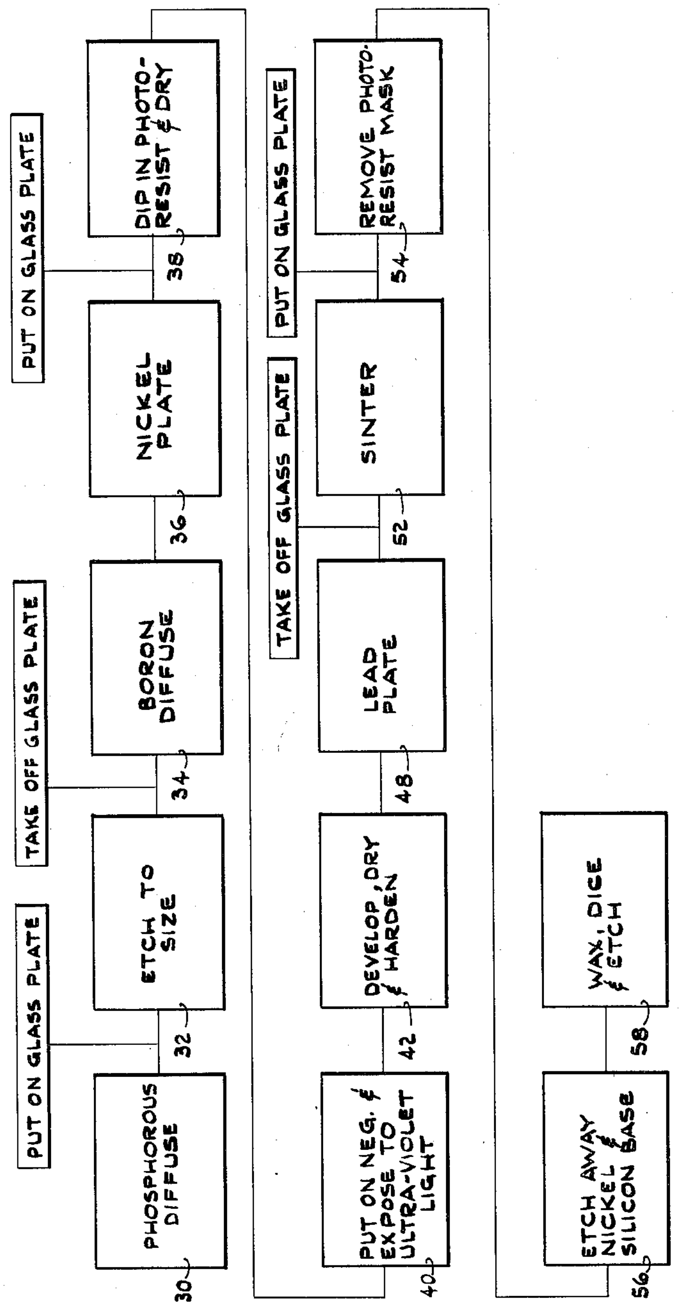
FIGURE 1 is a block diagram showing the steps in a method of this invention.
Figure 6:
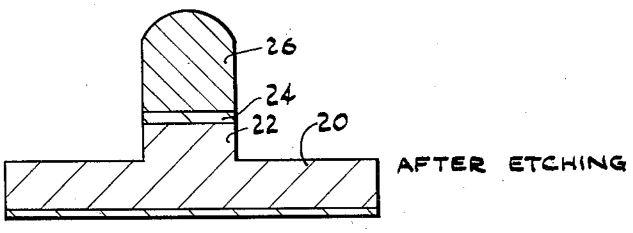
FIGURE 6 is a section of the material after the nickel plate and the portion of the silicon base have been etched.

In the drawings, in FIGURE 1, is shown a block diagram of a process of this invention for making small diodes having a layer of nickel plate on a mesa of silicon and a thicker layer of lead plate for electrical connection on the nickel plate. This construction is shown in FIGURE 6 where a silicon base 20 has a mesa 22 which is covered by a nickel plate 24 and a thicker lead plate 26. The diameter of the mesa is approximately equal to that of a human hair.

Figure 2:
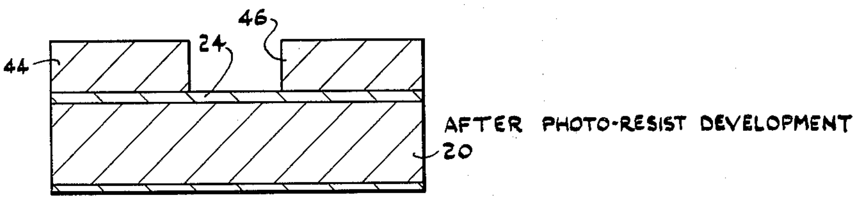
FIGURE 2 is a cross section of the material as it appears after the development step of the masking material.
Figure 3:
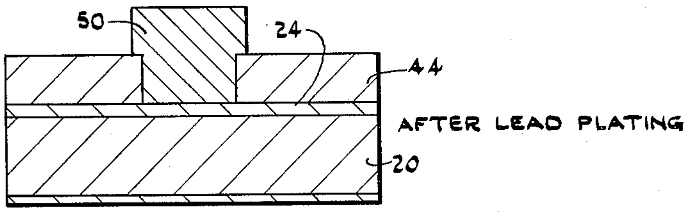
FIGURE 3 is a section of the material as it appears after the lead plating.
Figure 4:
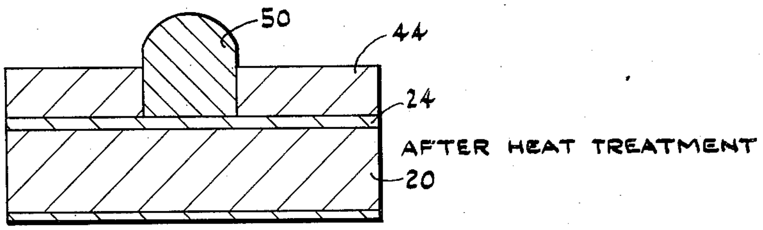
FIGURE 4 is a section of the material after the lead plating has been heat treated.
Figure 5:
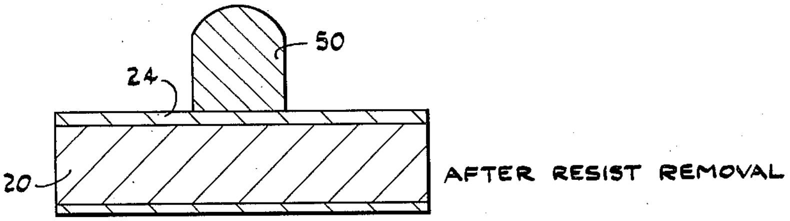
FIGURE 5 is a section of the material after the masking material has been removed.

In the first step of a preferred embodiment of this invention a silicon base or slab 20 is diffused with phosphorous to provide a layer of N type silicon to a predetermined thickness, which step is represented by box 30 in FIGURE 1. At this point the silicon slab 20 is placed on a glass plate and then is etched to size (box 32); after this, the diffused slab of silicon is removed from the glass plate and diffused with boron to provide a layer of p-type silicon (box 34); the phosphorous and boron diffused slab is now electroless nickel plated by dipping the slab in a nickel solution at 95° C. for one minute, sintering the nickel plated slab at 820° C. for four minutes, and then further plating the electroless nickel plate in the nickel solution at 95° C. for five minutes (box 36). The plated slab is again placed on a glass plate and dipped at room temperature into Kodak Photo Resist material and the photo resist material is then allowed to dry at room temperature (box 38); a negative having a series of uniform opaque dots arranged in rows and columns of equal spacing is then placed over the Photo Resist masking material and exposed to ultra violet light for 30–60 seconds (box 40); the exposed masking material is now developed in a Kodak Photo Resist developer which dissolves the unexposed portion of the masking material as shown in FIGURE 2 where masking material 44 has an opening 46 created by the dissolving of an unexposed portion; the slab then has a lead deposit 50 electroplated to each exposed nickel surface 24 until the lead coating reaches a desired thickness as shown in FIGURE 3, which may be the lead plating resulting from a 6 milliampere current for five minutes (box 48); then the glass plate is removed and the lead is heated to solidify it and promote adhesion to the nickel at 400° C. for six minutes melting the lead (box 52); then the glass plate is again placed on the bottom of the slab; the Photo Resist mask is then removed by commercial paint stripper and brushed off (box 54) leaving a series of lead deposits 50 on a nickel plate 24 as shown in FIGURE 4; the slab 20 is then subjected to an etching bath which is preferably a 1–2–4–5 solution of, respectively, concentrated nitric acid, concentrated hydrofluoric acid, concentrated sulphuric acid, and water solution (the sulphuric acid forms an etch resistant coating of lead sulfate on the lead deposit 50) until the exposed nickel surfaces have been etched away and a predetermined thickness of a silicon base has been etched away (box 56), showing the mesa configuration in FIGURE 6; the exposed silicon base is then wax coated and a series of lines are drawn through the wax to form a grid with a mesa being in the center of each square of the grid, after which an etching solution is applied over the wax separating the slab into separate diodes.

Although this invention has been disclosed and illustrated with reference to particlular applications, the principles involved are susceptible of numerous other applications which will be apparent to persons skilled in the art. The invention is, therefore, to be limited only as indicated by the scope of the appended claim.

Having thus described our invention, we claim:

A method of manufacturing p-n junction semiconducting silicon base devices comprising the steps of coating the upper and lower faces of a silicon base material with electroless nickel, applying to the upper nickel coated face a masking material which hardens to chemical action on exposure to light, placing a photographic negative having a series of uniform opaque dots upon said masking material, exposing said negative to ultraviolet light, developing said masking material with a developer which dissolves the unexposed areas of said masking material, electroplating lead onto the nickel plate exposed by dissolution of said masking material, removing said masking material leaving a series of lead projections on said upper nickel coated face, etching the uncovered upper nickel coated face and a predetermined portion of the silicon base material with an etching solution of concentrated nitric acid, concentrated hydrofluoric acid, concentrated sulphuric acid and water, whereby the lead deposits are protected from the etch by a coating of lead sulphate, waxing the surface of the etched portion of the silicon base material, drawing lines through the wax to expose a grid of lines upon said silicon base material to divide said base material into small squares each having a lead mesa thereon, and etching the exposed lines with said etching solution to separate the small squares.

References Cited in the file of this patent

UNITED STATES PATENTS

| | | |
|---|---|---|
| 2,443,119 | Rubin | June 8, 1948 |
| 2,662,957 | Eisler | Dec. 15, 1953 |
| 2,728,693 | Cado | Dec. 27, 1955 |
| 2,878,147 | Beale | Mar. 17, 1959 |
| 2,937,961 | Wolsky | May 24, 1960 |
| 2,978,367 | Kestenbaum et al. | Apr. 4, 1961 |
| 2,980,832 | Stein et al. | Apr. 18, 1961 |

FOREIGN PATENTS

| | | |
|---|---|---|
| 846,720 | Great Britain | Aug. 31, 1960 |
| 849,477 | Great Britain | Sept. 28, 1960 |

OTHER REFERENCES

Eisler: "The Technology of Printed Circuits," 1959, Hayword Company Ltd., London, pp. 111–115.

IBM Disclosure Bulletin, Etching PN Junctions, by Beliveau et al., vol. 2, No. 3, October 1959.